US010553426B2

(12) United States Patent
Feuillet et al.

(10) Patent No.: US 10,553,426 B2
(45) Date of Patent: Feb. 4, 2020

(54) METHOD FOR OBTAINING A SEMI-POLAR NITRIDE LAYER ON A CRYSTALLINE SUBSTRATE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE—CNRS, Paris (FR)

(72) Inventors: Guy Feuillet, Saint-Martin D'Uriage (FR); Michel El Khoury Maroun, Antibes (FR); Philippe Vennegues, Antibes (FR); Jesus Zuniga Perez, Biot (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 0 days.

(21) Appl. No.: 15/779,269

(22) PCT Filed: Nov. 30, 2016

(86) PCT No.: PCT/EP2016/079345
§ 371 (c)(1),
(2) Date: May 25, 2018

(87) PCT Pub. No.: WO2017/093359
PCT Pub. Date: Jun. 8, 2017

(65) Prior Publication Data
US 2018/0330941 A1 Nov. 15, 2018

(30) Foreign Application Priority Data
Nov. 30, 2015 (FR) ...................................... 15 61619

(51) Int. Cl.
*H01L 21/02* (2006.01)
*H01L 33/18* (2010.01)
(Continued)

(52) U.S. Cl.
CPC .......... *H01L 21/0254* (2013.01); *C30B 25/04* (2013.01); *C30B 25/186* (2013.01);
(Continued)

(58) Field of Classification Search
CPC ......... H01L 21/02381; H01L 21/02433; H01L 21/02488; H01L 21/0254; H01L 21/0262; H01L 21/02647–0265; C30B 29/40
See application file for complete search history.

(56) References Cited

U.S. PATENT DOCUMENTS

2012/0119218 A1* 5/2012 Su .......................... C30B 25/18
257/76
2012/0276722 A1 11/2012 Chyi et al.

OTHER PUBLICATIONS

J. Cao et al., "Improved quality GaN by growth on compliant silicon-on-insulator substrates using metalorganic chemical vapor deposition," Journal of Applied Physics, vol. 83, No. 7, Apr. 1, 1998, pp. 3829-3834, XP0120449956. (Year: 1998).*
(Continued)

*Primary Examiner* — Daniel P Shook
(74) *Attorney, Agent, or Firm* — Baker & Hostetler LLP (57) ABSTRACT

A process allowing at least one semipolar layer of nitride to be obtained, which layer is obtained from a least one among gallium, indium and aluminum on a top surface of a single-crystal layer based on silicon, wherein the process comprises the following steps: etching, from the top surface of the single-crystal layer, a plurality of parallel grooves comprising at least two opposite inclined facets, at least one of two opposite facets having a crystal orientation; masking the top surface of the single-crystal layer such that the facets having a crystal orientation are not masked; and epitaxial growth of
(Continued)

the semipolar layer of nitride from the not masked facets; wherein the etching is carried out on a stack comprising the single-crystal layer and at least one stop layer that is surmounted by the single-crystal layer and wherein the etching etches the single-crystal layer selectively with respect to the stop layer so that the etching stops on contact with the stop layer.

28 Claims, 7 Drawing Sheets

(51) Int. Cl.
    *H01L 33/32*     (2010.01)
    *C30B 25/04*     (2006.01)
    *C30B 25/18*     (2006.01)
    *C30B 29/40*     (2006.01)

(52) U.S. Cl.
    CPC ...... *C30B 29/403* (2013.01); *H01L 21/02381* (2013.01); *H01L 21/02433* (2013.01); *H01L 21/02458* (2013.01); *H01L 21/02488* (2013.01); *H01L 21/02639* (2013.01); *H01L 21/02647* (2013.01); *H01L 33/18* (2013.01); *H01L 33/32* (2013.01)

(56) References Cited

OTHER PUBLICATIONS

J. Cao et al., "Improved quality GaN by growth on compliant silicon-on-insulator substrates using metalorganic chemical vapor deposition," Journal of Applied Physics, vol. 83, No. 7, Apr. 1, 1998, pp. 3829-3834, XP012044956.

Chiu et al., "Growth of semi-polar GaN-based light-emitting diodes grown on an patterned Si substrates," Gallium Nitride Materials and Device, vol. 7939, No. 1, Feb. 10, 2011, pp. 1-5, XP060010970.

J. Cao, et al., "Improved Quality GaN by Growth on Compliant Silicon-on-Insulator Substrates Using Metalorganic Chemical Vapor Deposition", Journal of Applied Physics, Apr. 1, 1998, pp. 3829-3834, vol. 83, No. 7, American Institute of Physics, US, XP012044956.

Masataka Imura, et al., "Annihilation Mechanism of Threading Dislocations in A1N Grown by Growth Form Modification Method Using V/III Ratio", Journal of Crystal Growth, Feb. 28, 2007, pp. 136-140, vol. 300, No. 1, Elsevier, Amsterdam, NL, XP005915229.

D. Zubia, et al., "Nanoheteroepitaxial Growth of GaN on Si by Organometallic Vapor Phase Epitaxy", Applied Physics Letters, Feb. 14, 2000, pp. 858-860, vol. 76, No. 7, American Institute of Physics Publishing LLC, US, XP012025868.

Ching-Hsueth Chiu, et al., "Growth of Semi-Polar GaN-based Light-Emitting Diodes Grown on an Patterned Si Substrate", Gallium Nitride Materials and Devices VI, Feb. 10, 2011, pp. 1-5, vol. 7939, No. 1, Proc. of SPIE, Bellingham, WA, USA, XP060010970.

\* cited by examiner

METHOD FOR OBTAINING A SEMI-POLAR NITRIDE LAYER ON A CRYSTALLINE SUBSTRATE

CROSS-REFERENCE TO RELATED APPLICATIONS

This application is a National Stage of International patent application PCT/EP2016/079345, filed on Nov. 30, 2016, which claims priority to foreign French patent application No. FR 1561619, filed on Nov. 30, 2015, the disclosures of which are incorporated by reference in their entirety.

TECHNICAL FIELD OF THE INVENTION

The present invention relates, generally, to light-emitting diodes (LEDs). It more specifically relates to LEDs obtained from an epitaxial layer comprising at least one nitride (N) obtained with one at least among the following materials: gallium (Ga), indium (In) and aluminum (Al).

BACKGROUND

Light-emitting diodes produced from a nitride compound obtained with one or more materials in particular including gallium (GaN) and capable of emitting in the blue, have been well known for already more than a decade. However, their aptitude to also be able to effectively emit at a range of longer wavelengths, typically in the range of the visible spectrum corresponding to the green and to the red, runs up against intrinsic difficulties related to the crystal symmetry of the materials used, which limits the current-light conversion efficiency of diodes designed to emit in this wavelength range. Specifically, to be able to emit wavelengths longer than the blue requires recourse to be made, to form the active light-emitting zone, to nitride alloys of gallium and indium (GaInN) including high concentrations of indium. A problem that arises is that of how to incorporate the increasing proportions of indium that are then necessary into the GaInN alloys without degrading the structural quality of the emitting zones and therefore the emission capacity thereof.

Figure 1:
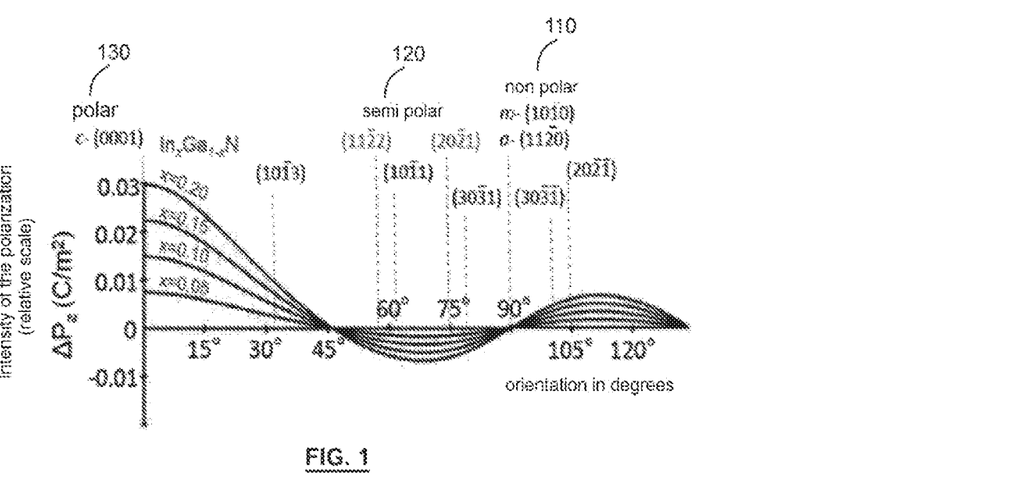
FIG. 1 is a graph showing the severity of polarization effects as a function of crystal orientation.

A second problem that arises for the entire range of wavelengths that may be produced with these nitrides, blue included, is related to the crystal symmetry of this family of materials. Specifically, these materials of hexagonal symmetry, if they are grown epitaxially in a principal crystal direction called the "c" direction, develop a spontaneous and piezoelectric polarization along this direction. An internal electric field is created that has the negative effect of separating electrons and holes spatially in the active emission zone, this translating directly into a loss of radiative efficiency. Since the polarization is directed along the c axis, the "polar" orientation of the crystal, it is advantageous to use epitaxial growth directions that are inclined with respect to this axis, for which directions the polarization component will be lower or even zero, as illustrated in FIG. 1. FIG. 1 also shows the influence of the proportion of indium 130 contained in the alloy on this parameter. These directions are commonly called "nonpolar" directions 110 or "semipolar" directions 120. Moreover, the incorporation of indium into the nitrides employed may be facilitated when the epitaxial growth is carried out from surfaces corresponding to certain of these orientations. It will therefore be understood how important it is to privilege such crystal orientations in order to increase the performance of green LEDs and, above all, LEDs emitting at a range of longer wavelengths extending from the yellow to the red, the efficiency of which is at the present time still too low for potential industrial use thereof to be envisionable.

Known methods for obtaining epitaxially grown layers of nitride compounds such as those mentioned above, in nonpolar and semipolar directions, are briefly described below.

The problem to be addressed is that of determining which substrate to use to allow an epitaxial growth in nonpolar directions 110 or semipolar directions 120. If it is desired to simultaneously minimize the defect concentration in the epitaxially grown layers, the most suitable method is to use substrates of the same nature as the layers to be epitaxially grown (homo-substrates). In the case of the aforementioned nitrides, bulk ingots of GaN, drawn in the c direction, are still only of small size, typically of a diameter smaller than 1 inch (2.5 cm), this meaning that it is not possible to cut therefrom substrates that are inclined with respect to the c axis of sufficient size for the envisioned industrial applications, these substrates then typically being smaller than a few $cm^2$ in size.

One solution that is not affected by the above dimensional problem consists in using layers deposited in the right crystal direction on a substrate of suitable orientation, for example a sapphire substrate of larger size and of suitable orientation. These layers, which are commonly called templates, acquire the desired orientation, i.e. a nonpolar orientation 110 or semipolar orientation 120, via quasi "heteroepitaxial" growth on the chosen substrate, which is for example made of sapphire. However, the layers thus obtained are observed to be riddled with a high number of stacking defects that extend in the c plane, inclined with respect to the surface, and that therefore emerge on the surface of the grown layer and, to a lesser extent, with a certain number of dislocations. The epitaxial growth of these templates merely increases the length of these defects. When these defects cross the active zones, they induce therein non-radiative recombination or radiative recombination at shorter wavelengths. This at least partially explains the lower current-light conversion efficiency of LEDs manufactured from such layers.

Figure 2:
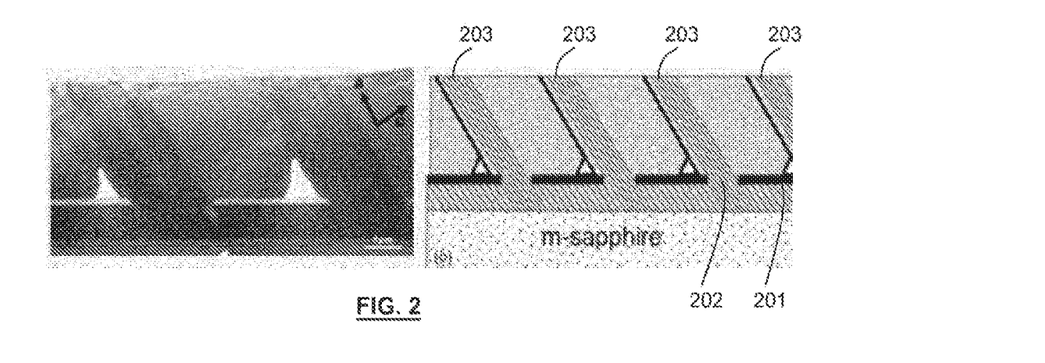
FIG. 2 shows the results of growth of a nitride layer obtained by epitaxial lateral overgrowth (ELO).

In order to attempt to mitigate these difficulties, recourse may be had to what are called "epitaxial lateral overgrowth" (ELO) methods. At a certain stage in the growth of the layer, a mask 201 is deposited with the aim, on the one hand, of blocking dislocations under the mask and, on the other hand, of causing the remaining dislocations to curve during the lateral overgrowth that occurs over the mask. Such a method is for example described in the following publication, which was published in Semiconductor Science and Technology Volume 27 Number 2 (2012), entitled "Defect reduction methods for III-nitride heteroepitaxial films grown along nonpolar and semipolar orientations" by P. Vennéguès and co-authors. As shown in FIG. 2, although defects and dislocations under the mask 201 are observed to indeed be effectively blocked, the stacking defects do not curve like the dislocations and those 203 that manage to propagate through the apertures 202 of the mask may reach the surface. The right-hand illustration of FIG. 2 is a schematic view of the left-hand illustration, which is a photo.

Figure 3A:
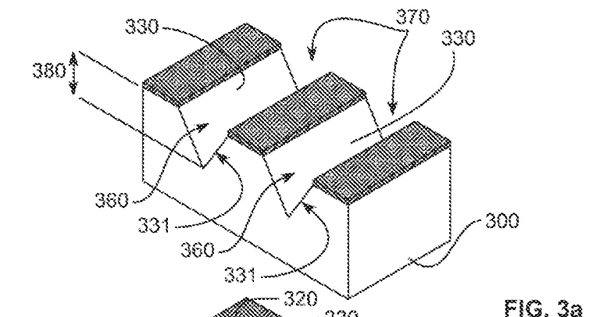
FIGS. 3a-3f illustrate the steps of a process for localized heteroepitaxial semipolar growth of a layer of GaN.
Figure 3B:
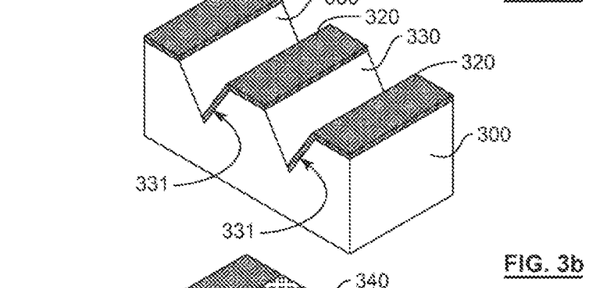
Figure 3C:
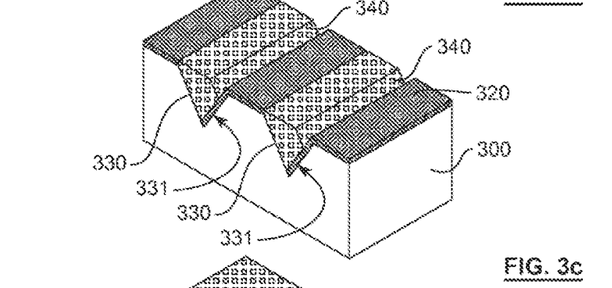

Other solutions have therefore been developed that attempt, rather than to block the stacking defects, to avoid creating them. This type of method is based on "faceting" substrates so as to initiate the growth locally on facets created on the surface of said substrates, which facets allow GaN to be grown epitaxially in the c, i.e. (0001) direction, as shown in FIGS. 3a to 3f. As shown in FIG. 3b, beyond the facets 330, the substrate is covered with a dielectric mask

Figure 3D:
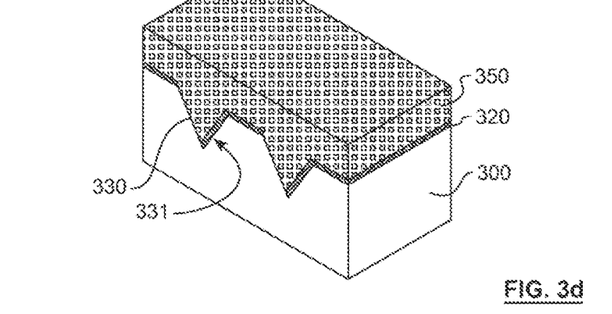
Figure 3E:
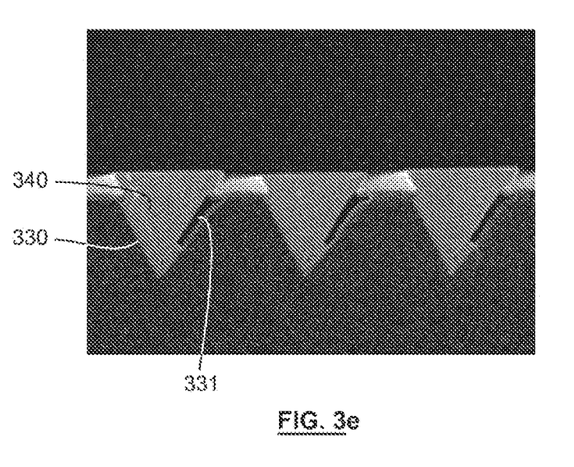
Figure 3F:
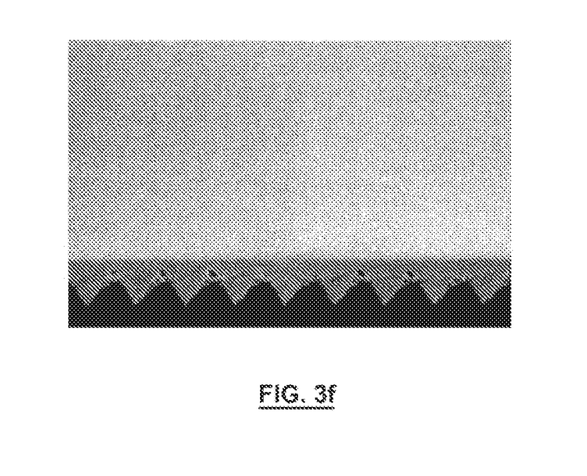

320. In this case, stacking defects, generated at the start of growth, and which by nature are aligned with the c {0001} plane are confined in a thin zone close to the interface between the facet and the layer. In addition, the growth of the crystallites on the facets is accompanied by curvature of the dislocations in the first moments of growth. The originality of this approach resides in the fact that the orientation of the substrate 300, and therefore the inclination of the facets, is chosen so that the coalescence of the various crystallites produces, in the end, as shown in FIG. 3d, a planar and continuous GaN surface 350 with the desired semipolar orientation. The zone containing stacking defects is very small in size, typically of a few nanometers in thickness. Such methods have been developed by various laboratories on substrates made of silicon or of sapphire. The reader may for example refer to the following publications: "T. Honda et al., Journal of Crystal Growth 242 (1-2), 82 (2002)"; "B. Leung et al., Applied Physics Letters 104 (26) (2014)" and "T. Tanikawa et al., Physica Status Solidi (C) 5 (9), 2966 (2008)". For substrates made of sapphire and substrates made of silicon, the facets 330 are revealed chemically or by dry etching. FIGS. 3a to 3d illustrate the succession of steps required to obtain the continuous layer 350 starting, for example, with a {001} silicon substrate 300 with a disorientation of 7°. For growth on silicon, facets 330 of {111} orientation are revealed by chemical etching using KOH or potassium hydroxide. The starting substrate is masked and the chemical etching takes place through apertures 370 in the mask, thus forming grooves 360. The etch time sets the etching depth 380 and therefore the height of the {111} facets 330 exposed. As described above, and since the GaN growth has a +c orientation on the {111} facets 330 of the silicon, the initial orientation of the silicon is precisely chosen so as to select the desired semipolar orientation of the surface of the GaN layer 350. This has allowed on the whole satisfactory results to be obtained on various silicon orientations and therefore for various GaN-layer semipolar orientations. An experimental example is illustrated in FIGS. 3e and 3f in the case of growth of GaN on {001} silicon with a disorientation of 7° in the <110> direction. It will be noted here that the use of silicon substrates is always preferable insofar as silicon is the material that is most commonly used in the microelectronics industry and thus large silicon substrates are available at low cost.

Although providing certain improvements, the methods of localized heteroepitaxial semipolar growth which were briefly described above still have many limitations.

In particular, growth of GaN on a silicon substrate runs up against additional difficulties related to the appearance of an effect called "melt-back etching" in the step of growth of the nitride layer such as a layer of GaN. This destructive effect is a result of the reactivity of silicon with gallium. Specifically, in the phase of growth of the crystallites, the silicon sees its temperature increase enough that it can react with the gallium. This reaction generally leads to the creation of cavities in the silicon.

These cavities decrease the quality of the substrate and therefore LED performance. Moreover, they appear randomly on the surface of the silicon, this resulting in LEDs obtained from a given stack of layers having a low uniformity.

In order to avoid this untimely etching of the silicon by the gallium, it is possible to deposit a buffer layer of aluminum nitride (AlN) on the silicon before starting the GaN growth. Although this buffer layer of aluminum nitride (AlN) allows the "melt-back etching" effect to be limited, in practice it is rare to be able to completely eliminate it.

There is therefore a need to provide a solution allowing a nitride layer, for example a layer of gallium nitride, of semipolar orientation, to be obtained from facets oriented in the {111} crystal plane of a silicon layer and that allows the appearance of the melt-back-etching effect to be further decreased.

Other aims, features and advantages of the present invention will become apparent on examining the following description and the accompanying drawings. It will be understood that other advantages may be incorporated.

SUMMARY OF THE INVENTION

According to one embodiment, one subject of the present invention is a process allowing at least one semipolar layer of nitride (N) to be obtained, which layer is obtained from a least one among gallium (Ga), indium (In) and aluminum (Al) on a top surface of a single-crystal layer based on silicon or germanium, said process comprising the following steps:

etching, from the top surface of the single-crystal layer, a plurality of parallel grooves that mainly extend in a first direction, each groove comprising at least two opposite inclined facets, at least one of said two opposite facets having a {111} crystal orientation;

forming a mask on the single-crystal layer such that the facets opposite said facets having a {111} crystal orientation are masked and that said facets having a {111} crystal orientation are not masked; and epitaxial growth of said semipolar layer of nitride from said not masked facets.

Advantageously, said etching is carried out on a stack comprising the single-crystal layer and at least one stop layer that is surmounted by the single-crystal layer.

Advantageously, said etching etches said single-crystal layer selectively with respect to said stop layer so that said etching stops on contact with said stop layer.

According to one embodiment, said step of epitaxial growth comprises:

a first epitaxial growth of a material based on aluminum nitride (AlN) from said not masked facets that have a {111} crystal orientation;

then at least one second epitaxial growth of a material based on gallium nitride (GaN) from said material based on aluminum nitride (AlN).

Advantageously, the single-crystal layer has a thickness smaller than or equal to 900 nm ($10^{-9}$ meters).

In the context of the development of the present invention it has been discovered that, to limit melt-back etching, the buffer layer, for example of AlN, cannot in practice, and at a cost that is not prohibitive, be deposited with a sufficient density and continuity for it to be able to prevent the etching of the single-crystal layer based on silicon or germanium by the gallium. A gradual deterioration of the nitride layer results.

By growing the layers of AlN and GaN from facets defined by grooves the depth of which is small and controlled by etching with the etching stopped on a stop layer subjacent to the single-crystal layer based on silicon or germanium, the invention allows the risk of appearance of this melt-back etching to be decreased or even avoided.

Specifically, by obtaining the grooves by etching with the etching stopped on the stop layer subjacent to the single-crystal layer based on silicon or germanium, the invention allows the depth of the grooves to be controlled in a particularly precise way. This allows the size of the facets to be very precisely controlled and their size to be decreased.

In the context of the development of the present invention, it has been observed that the nucleation of the melt-back etching occurs randomly on the surface of the substrate.

Moreover, it has been observed, unexpectedly, that with a thickness of the single-crystal layer smaller than or equal to 900 nm, a very substantial reduction in the risk of nucleation of this effect is obtained. In contrast, it has been discovered that for larger thicknesses, typically larger than one micron or a few microns, the decrease in melt-back etching is not significant. Moreover, for these larger thicknesses, the risk of melt-back etching does not decrease or decreases little when the thickness of the single-crystal layer is decreased.

The invention therefore allows this effect to be amply minimized or even eliminated.

The process according to the present invention has other advantages.

In particular, in known solutions based on nitride growth from grooves it is the duration of the chemical etching of the substrates based on silicon or germanium that defines the depth 331 of the grooves and therefore the height and sometimes the shape of the facets 330 of {111} orientation. For silicon, the upper limit of the size of the facets is determined by the intersection of the various {111} planes that are revealed by the KOH chemical etch. As regards the lower limit, it greatly depends on the parameters of the initial phase of KOH etching, the etching often initiating locally before spreading to the rest of the wafer. In addition, the etch rate depends closely on the KOH concentration, on temperature and on the orientation of the silicon in question. In the context of the development of the present invention, it has therefore been observed that it is difficult in practice to ensure a sufficient reproducibility and a sufficient uniformity, especially with substrates that are large in size. In the context of the development of the present invention, for KOH etches of silicon substrates of a diameter of 2 inches (50 mm), nonuniformities of about 10 to 50% in etch depth, and therefore corresponding dispersions in facet height over the extent of the substrate, have been measured. Since the size of the facets directly influences the size of the GaN crystallites 340 originating from each of the facets 330, it has been observed that their lack of heightwise uniformity then translates into nonuniformities in crystallite size and therefore in an erratic coalescence. This prevents the obtainment of a planar layer 350 allowing complex structures, such as quantum-well heterostructures, which are very demanding in terms of the crystal perfection that must be obtained, to be produced.

The invention, by allowing facets to be produced the sizes of which are controlled and much more uniform over the wafer, allows planar layers of more uniform thickness to be obtained.

Furthermore, as already seen above, dislocations that originate at the interface between a GaN crystallite and a silicon facet curve toward the bottom and top faces of the latter, thereby allowing their density to be rapidly decreased. However, in the context of the development of the present invention, it has been observed that the width of the dislocation-containing zone that emerges onto the top surface of the crystallite is directly dependent on the initial height of the silicon facet from which these dislocations originate. Decreasing the width of the facets therefore allows the average density of dislocations and the extent of the zone onto which they emerge to be decreased. This requires a precise control of the chemical etch depth, which however is difficult to obtain in practice with known solutions, because of the brevity of the etch times that must be employed to create the facets. With known solutions, non-uniformities in facet size lead to the obtainment of crystallites the base of which is nonuniform over the extent of the substrate and therefore to dislocation densities that vary from one edge of said substrate to the other. For applications in the field of optics or electronics, for example for the production of LEDs, lasers or even high-electron mobility transistors (HEMTs) made of GaN, this is unacceptable, insofar as the components will be of different quality depending on the position that they occupy on the epitaxially grown substrate.

The invention, by allowing facets to be produced the heights of which are more uniform over the wafer, allows the density of dislocations to be decreased to zero or to be made much lower and in any case much more uniform in a given layer. The quality of the components obtained from a given substrate is therefore less variable.

Optionally, the process of the invention may furthermore have at least any one among the following optional steps and features, separately or in combination:

According to one embodiment, the thickness of the single-crystal layer is such that, in the etching step, the two opposite inclined facets of a given groove reach the stop layer without meeting.

According to one embodiment, the first direction, in which the grooves extend, corresponds to a direction common to the plane of the top surface and to the <111> plane.

According to one embodiment, said step of epitaxial growth comprises:

a first epitaxial growth of a material based on aluminum nitride (AlN) from said not masked facets that have a {111} crystal orientation;

then at least one second epitaxial growth of a material based on gallium nitride (GaN) from said material based on aluminum nitride (AlN).

According to one embodiment, the first epitaxial growth is carried out so that the material based on gallium nitride (GaN) entirely covers the single-crystal layer.

According to one embodiment, the first epitaxial growth relates to a material made of aluminum nitride (AlN).

According to one embodiment, the grooves have a flat bottom and the two opposite faces meet at the bottom of the groove.

According to one embodiment, the stop layer is configured to allow an epitaxial growth from the single-crystal layer without epitaxial growth from the stop layer.

According to one embodiment, the stop layer is electrically insulating.

According to one embodiment, the stop layer is amorphous.

According to one embodiment, the stop layer does not react chemically with the layer said semipolar nitride layer.

According to one embodiment, the single-crystal layer makes direct contact with the stop layer.

According to one embodiment, the stack comprises a carrier layer surmounted by the stop layer.

According to one embodiment, the stop layer makes direct contact with the carrier layer.

According to one embodiment, the stop layer is obtained by oxidizing one surface at least of the carrier layer.

According to one embodiment, the stop layer is a layer chosen from: a layer of oxide, a layer of SiC, and a layer of $Al_2O_3$.

According to one embodiment, the single-crystal layer is a thin layer.

According to one embodiment, the single-crystal layer has a thickness comprised between 2 nm ($10^{-9}$ meters) and 900 nm and preferably between 5 nm and 500 nm and preferably between 10 nm and 50 nm.

According to one embodiment, the single-crystal layer has a thickness smaller than or equal to 750 nm. These thicknesses allow the melt-back etching to be considerably minimized.

According to one embodiment, the single-crystal layer has a thickness smaller than or equal to 600 nm and preferably smaller than or equal to 500 nm and preferably smaller than or equal to 300 nm and preferably smaller than or equal to 200 nm. These thicknesses allow the effect of nucleation by melt-back etching to be even more considerably minimized.

According to one embodiment, the single-crystal layer has a thickness comprised between 50 nm and 600 nm and preferably a thickness comprised between 50 nm and 300 nm. These thicknesses allow the effect of nucleation by melt-back etching to be considerably minimized.

According to one embodiment, the single-crystal layer is a layer obtained beforehand on a donor substrate then added to the stop layer.

According to one embodiment, each groove is continuous.

According to one embodiment, the V/III molar ratio of said material containing nitride (N) and at least one among gallium (Ga), indium (In) and aluminum (Al) is comprised between 100 and 2000.

According to one embodiment, the V/III molar ratio of said material containing nitride (N) and at least one among gallium (Ga), indium (In) and aluminum (Al) is comprised between 300 and 500 and preferably between 380 and 420.

According to one embodiment, the step of forming a mask comprises an angular deposition of a masking material, which deposition is carried out such that all the single-crystal layer is covered with the exception of said facets that have a {111} crystal orientation.

According to one embodiment, the masking material comprises at least one among the following materials: silicon oxide (SiO$_2$), silicon nitride (SiN), and titanium nitride (TiN).

According to one embodiment, the nitride is gallium nitride (GaN).

According to one embodiment, the nitride is based on gallium nitride (GaN) and the gallium nitride (GaN) furthermore comprises aluminum (Al) and/or indium (In).

According to one embodiment, the nitride is any one among: gallium nitride (GaN), indium nitride (InN), aluminum nitride (AlN), aluminum gallium nitride (AlGaN), indium gallium nitride (InGaN), aluminum gallium indium nitride (AlGaInN), aluminum indium nitride (AlInN), and aluminum indium gallium nitride (AlInGaN).

According to one embodiment, the plurality of parallel grooves has a pitch p1 that is comprised between 50 nm and 20 µm.

According to one embodiment, the pitch p1 is comprised between 75 nm and 15 µm.

According to one embodiment, the parallel grooves of the plurality of parallel grooves mainly extend in a first direction, and the process also comprises the following steps, which are executed after the step of obtaining the plurality of parallel grooves and before the step of epitaxial growth of the single-crystal layer:
etching a plurality of parallel trenches that extend in a second direction having undergone a rotation with respect to said first direction, and that thus interrupt the continuous grooves so as to form a matrix-array of individual facets each having a {111} single-crystal orientation.

Advantageously, during said epitaxial growth step, said material grows solely from said individual facets that have a {111} crystal orientation and that form said matrix-array.

Preferably, the trenches and the grooves each having a bottom, the bottom of the trenches being located at the same depth or below the bottom of the grooves.

The formation of the trenches, which are inclined with respect to the grooves, allows the available areas of the facets, i.e. the facets with a {111} orientation and from which the nitride comprising at least one among Ga, In and Al may be grown, to be decreased, thereby achieving a decrease in footprint and thus a decrease in the number of extended defects during the epitaxial growth generated at the GaN/AlN/Si or AlN/Si interface, while imposing growth in the appropriate +c direction.

The invention and the proposed process thus allow the density of extended defects that propagate to the surface to be decreased, and, thus, on semipolar orientations that greatly decrease polarization effects, it is possible to obtain green LEDs of higher efficiency.

Advantageously, during said epitaxial growth step, said material grows only from said individual facets that have a {111} crystal orientation and that form said matrix-array.

According to one embodiment, said first and second directions define an angle that is larger than 40° and that is preferably comprised between 50° and 90°.

According to one embodiment, said angle is comprised between 60° and 90°.

According to one embodiment, the trenches are etched perpendicular to the initial grooves.

According to one embodiment, the trenches have a depth that is equal to or larger than the depth of the grooves.

According to one embodiment, the trenches have vertical sidewalls. Preferably, the trenches and the grooves each have a bottom, the bottom of the trenches being located at the same depth or below the bottom of the grooves.

According to one embodiment, the plurality of parallel grooves has a pitch p1 and wherein the plurality of parallel trenches have a pitch p2 that is larger than $$\frac{p1*0.8}{2.5}$$

and preferably larger than $$\frac{p1*0.9}{2.5}.$$

According to one embodiment, the plurality of parallel grooves has a pitch p1 and wherein the plurality of parallel trenches has a pitch p2 that is smaller than 1.1*p1 and preferably lower than p1.

According to one embodiment, during the step of the epitaxial growth, the temperature of the substrate is kept between 700 and 1,300° C. and preferably between 900 and 1,100° C.

According to one embodiment, during the step of the epitaxial growth, the pressure is kept between 30 mbar and 1500 mbar and preferably between 50 mbar and 700 mbar.

According to one embodiment, the plurality of parallel grooves have a pitch p1, the plurality of parallel trenches have a pitch p2 that is comprised between 0.9*p1 and 1.1*p1, and the smallest angle defined by said first and second directions is larger than 40° and is preferably larger than 60°.

According to one embodiment, the single-crystal layer is made of silicon (Si) or a material based on silicon.

According to one embodiment, said step of etching a plurality of parallel trenches is carried out after the step of producing the plurality of parallel grooves and before the step of masking the top surface of the single-crystal layer, such that the facets opposite said facets having a {111} crystal orientation are masked.

According to one embodiment, the invention relates to a process for manufacturing at least one light-emitting diode (LED) configured so as to emit at least in the range of the green wavelengths, comprising the process as claimed in any one of the preceding claims allowing a semipolar layer to be obtained of least one material comprising a nitride (N) and at least one among gallium (Ga), indium (In) and aluminum (Al) on a top surface of a single-crystal substrate.

According to another embodiment, one subject of the present invention is a microelectronic device comprising a single-crystal layer and a semipolar layer of at least one layer of a nitride of at least one among gallium (Ga), indium (In) and aluminum (Al) on a top surface of said single-crystal substrate, the single-crystal layer comprising a plurality of parallel grooves, each groove comprising at least two opposite inclined facets each forming a continuous band, at least one of said two opposite facets having a {111} crystal orientation;

said nitride layer makes direct contact with the facets having a {111} crystal orientation.

The single-crystal layer surmounts a stop layer. Each groove extends from a top face of the stop layer and passes right through the single-crystal layer.

According to one embodiment the grooves have a flat bottom that is formed by the top face of the stop layer.

According to one embodiment, the device also comprises a masking layer placed between the single-crystal layer and the nitride, the masking layer covering the entirety of the top surface of the signal-crystal layer with the exception of the facets having a {111} crystal orientation.

According to one embodiment, the invention relates to a light-emitting diode (LED) comprising a microelectronic device according to any one of the two preceding claims.

By microelectronic device, what is meant is any type of device produced by means proper to microelectronics. These devices in particular encompass, in addition to devices intended for purely electronic purposes, micromechanical or electromechanical devices (MEMS, NEMS, etc.) and optical or optoelectronic devices (MOEMS, etc.).

BRIEF DESCRIPTION OF THE FIGURES

Aims, objects, features and advantages of the invention will become more clearly apparent from the detailed description of one embodiment of the latter, which embodiment is illustrated by the following accompanying drawings, in which.

The figures are given by way of example and do not limit the invention. They are schematic conceptual representations intended to facilitate the comprehension of the invention and are therefore not necessary to the same scale as practical applications. In particular, the relative thicknesses of the various layers and films are not representative of reality.

DETAILED DESCRIPTION OF THE INVENTION

It will be noted that, in the context of the present invention, the terms "on", "surmounts", "covers" and "subjacent" or their equivalents do not mean "in contact with". Thus, for example, the deposition of a first layer on a second layer, does not necessarily mean that the two layers make direct contact with each other but means that the first layer at least partially covers the second layer while being either directly in contact therewith or being separated therefrom by at least one other layer or at least one other element.

In the following description, thickness or height is measured in a direction perpendicular to the main faces of the various layers. In the figures, thickness or height is measured along the vertical.

Likewise, when it is indicated that an element is located plumb with another element, this means that these two elements are both located on the same line perpendicular to the main plane of the substrate, i.e. on a given line that is oriented vertically in the figures.

The general principle of the process according to the invention will now be described, then nonlimiting embodiments will be detailed with reference to FIGS. 4a to 4h.

This process provides a way of solving the problems posed by the growth of an epitaxial layer of semipolar or nonpolar orientation, of gallium nitride (GaN) and of nitride alloys including indium (In) and aluminum (Al).

The process of the invention advantageously makes provision to use processed silicon substrates of SOI type, SOI being the acronym for silicon-on-insulator. There are many well-known techniques for producing such substrates, which comprise a thin surface layer of silicon, preferably single-crystal silicon, which rests on a continuous insulating layer, which will play the role of the stop layer 420. The latter is often silicon oxide ($SiO_2$).

The single-crystal layer may thus be based on silicon, i.e. it may consist entirely of silicon or indeed it may comprise silicon and at least one other species. According to another embodiment, the single-crystal layer is based on germanium. In the rest of the description, the invention will be described with reference to a single-crystal layer based on silicon. The embodiments described below are applicable to a single-crystal layer based on germanium.

Generally, the insulating layer rests on a thick carrier, called the carrier layer below, intended to provide the assembly with a sufficient mechanical rigidity. The thick or bulk carrier, also called a base or bulk wafer, is also often made of silicon.

More generally, the invention makes use of substrates of SOX type, abbreviation used to designate any type of SOI substrate, i.e. substrates in which the insulating layer and the thick carrier may be made of materials other than silicon (Si) and its oxide ($SiO_2$). Thus, the carrier layer may be made of alumina (Al$_2$O$_3$) or silicon carbide (SiC) or even of any other material commonly used in the microelectronics industry.

The single-crystal surface layer, which is for example made of silicon, may be obtained using various known processes such as, for example, the well-known method called the smart-cut method. In this method, the surface layer is obtained from what is called a donor substrate. The surface layer is then added to the carrier layer by molecular bonding of an insulating layer, generally made of SiO$_2$, that was, before the addition, created on the surface of the carrier layer.

The crystal orientation of the single-crystal layer must be such that it will allow the desired semipolar orientation to be obtained during the subsequent growth of the nitride layer (of GaN for example) as was described above. The following table summarizes the various crystal orientations of the silicon surface layer that are liable to be suitable:

| Orientation of the Si top layer: | about: | toward: | Semipolar orientation of the GaN: |
|---|---|---|---|
| (001) disorientation 7° | [1-10] | [110] | [10-11] |
| (114) disorientation 1° | [110] | [-110] | [20-21] |
| (111) disorientation 4° | [0-1-1] | [-211] | [20-21] |
| (113) | | | [11-22] or [30-31] |

The crystal orientation and nature of the carrier layer or base wafer made of silicon or of one of the other materials mentioned above does not directly affect those of the nitride layer since the insulating layer playing the role of the stop layer 420 forms an interface between the carrier layer and the single-crystal surface layer. Regarding the production of the nitride layer (of GaN for example), only the single-crystal surface layer need be considered.

The choice of the material from which the carrier layer is made will possibly be dictated by other considerations such as its thermal conductivity, its thermal expansion coefficient, its transparency and other physical parameters that may depend on the particular use that is made of the invention. If the carrier layer is made of silicon, its crystal orientation is commonly {100} or {111}.

The thickness of the oxide layer or, more generally, that of the insulating layer created before addition of the single-crystal surface layer is also not a factor that will have a direct influence on the result of the implementation of the process according to the invention. It is commonly comprised in a range of values extending from 150 nm (nanometer=10$^{-9}$ m) to 900 nm (μm=10$^{-6}$ m) and more generally between 2 nm (10$^{-9}$ meters) and 900 nm and preferably between 5 nm and 500 nm and preferably between 10 nm and 50 nm.

According to one embodiment, the single-crystal layer has a thickness smaller than or equal to 750 nm, preferably smaller than or equal to 600 nm, preferably smaller than or equal to 500 nm and preferably smaller than or equal to 300 nm. These thicknesses allow the effect of nucleation by melt-back etching to be even more considerably minimized.

This insulating layer is chosen to be such that it forms a stop layer 420 during the etching that reveals the facets etched in the single-crystal surface layer. Typically, the etching is carried out via a chemical etch that etches the single-crystal surface layer with a high selectivity with respect to the stop layer 420.

The stop layer 420 is not necessarily insulating although the use of known processes for forming SOI-type structures is advantageous and these processes conventionally employ an insulating layer. Advantageously, the stop layer is amorphous. It does not react chemically with said semipolar nitride layer.

The stop layer 420 advantageously allows localized growth on the {111} facets defined by the single-crystal surface layer. More precisely, the growth of GaN on the chosen material must not be possible, in order to obtain a selective growth only on the {111} oriented facets revealed by the chemical etch. Silicon oxide (SiO$_2$) has the advantages of being simple to use and of having a good selectivity with respect to silicon in many etch chemistries. Moreover, it lends itself well to the molecular bonding carried out during the addition of the single-crystal surface layer. Silicon nitride (SiN) is also an advantageous material for forming the stop layer 420. Preferably, the stop layer 420 is amorphous, made of amorphous SiO$_2$ or SiN for example.

The stop layer 420 may be of nature other than SiO$_2$, provided that the chosen insulating material is inert with respect to the chemical etching used to reveal the facets (etching carried out, as was seen above, using KOH for example) in the silicon surface layer.

Figure 4A:
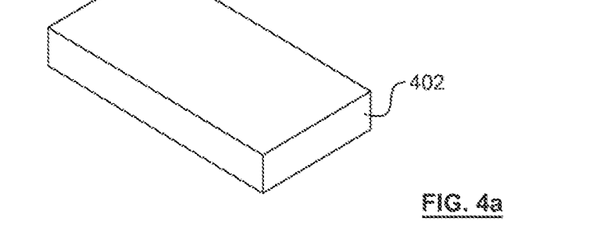
FIGS. 4a-4i illustrate the steps of an example process according to the invention for obtaining localized heteroepitaxial semipolar growth of a layer of GaN.
Figure 4B:
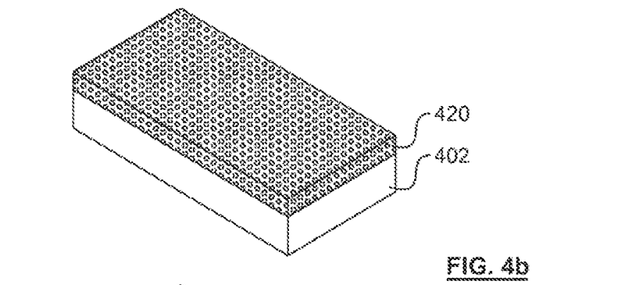
Figure 4C:
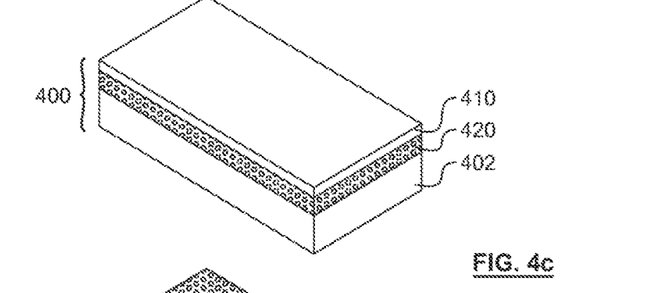
Figure 4D:
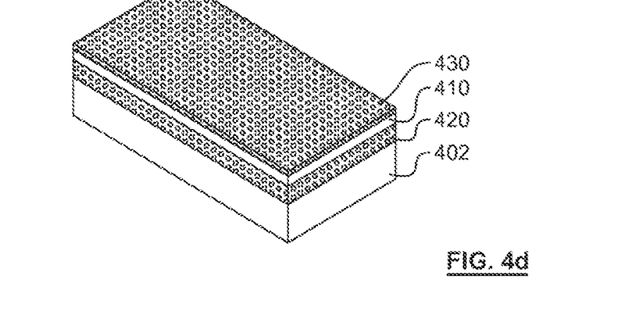

FIGS. 4a to 4i illustrate an example of implementation of the process of the invention on a stack, which in this case is an SOI substrate 400 as illustrated in FIG. 4c.

The orientation of the single-crystal surface layer 410 of the substrate, which is typically made of silicon, has a disorientation of the (001) crystal plane of 7° toward [110] so as to subsequently obtain an epitaxial layer of GaN of (10-11) orientation.

This SOI substrate 400 comprises the carrier layer 402 surmounted by the stop layer 420, which itself is surmounted by the single-crystal surface layer 410.

This SOI substrate 400 is for example obtained in a conventional way, as was briefly explained above and as illustrated in FIGS. 4a and 4b, starting with a thick carrier layer 402, which is for example made of silicon, the surface 404 of which is oxidized before addition of the single-crystal surface layer 410, for example using the technique called the "smart-cut" technique.

Preferably, before bonding, the single-crystal surface layer 410 is itself oxidized beforehand in order to facilitate the molecular bonding. The in-contact oxidized layers thus form the intermediate stop layer 420 of the SOI substrate.

Figure 4E:
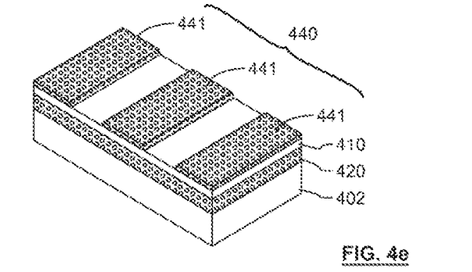
Figure 4F:
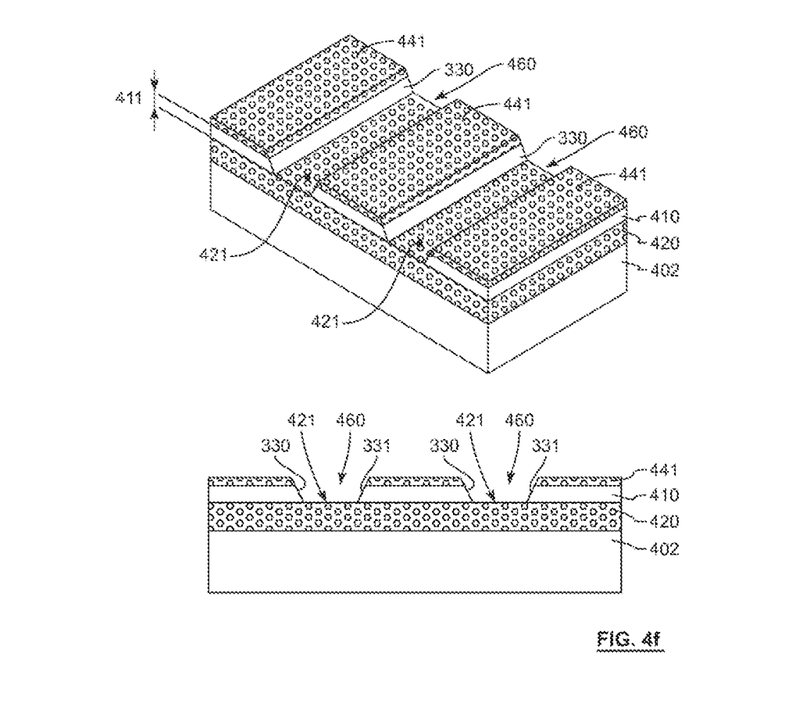

As illustrated in FIGS. 4e to 4f, grooves 460 are then etched in the single-crystal surface layer 410. These grooves are recessed patterns, and thus form trenches.

To do this, a mask 440 is produced on top of the single-crystal surface layer 410. The mask forms parallel bands 441 covering the single-crystal surface layer 410 and leaves uncovered other parallel bands of the single-crystal surface layer 410.

The mask 440 is produced by depositing or growing a layer of silicon oxide (SiO$_2$) or silicon nitride (SiN) 430. Next, the bands 441 are formed by lithography, for example by conventional photolithography and etching of the masking layer 430.

The parallel bands 441 are oriented in a preset crystal direction of the single-crystal surface layer 410. The crystal layer 410 has an internal face facing the stop layer 420 and an external face opposite the internal face, said external face also being designated the top surface. The direction of orientation of the parallel bands 441 must correspond to a direction common to the plane of the external face of the crystal layer 410 and to the <111> plane that it is desired to reveal via chemical etching. This direction is a <110> direction. Thus, the bands 441 are parallel to the intersection between the plane of the top surface of the single-crystal layer 410 and the <111> plane. In the example of implementation of the invention illustrated in FIG. 4, it is a question of a <110> direction.

The single-crystal surface layer 410 may then be chemically etched for example using KOH as already mentioned above or even tetramethyl ammonium hydroxide or TMAH.

The grooves 460 thus formed by etching are parallel to the bands 441. Thus, these grooves 460 define parallel grooves that are oriented in the direction common to the plane of the external face of the crystal layer 410 and to the <111> plane.

In the context of the invention, advantageously, the etching stops automatically when the stop layer 420, which is made of $SiO_2$ in this nonlimiting example, is reached. Thus, the etching stops before the facets 330 of {111} orientation meet as is the case in the conventional process described with respect to the prior art in which a bulk silicon substrate is used.

Thus, rather than setting the height of the facets 330 of {111} orientation via the etch time, said height is completely defined, with the process of the invention, by the thickness of the single-crystal silicon surface layer 410 of the SOI substrate.

The height of the facets 330 depends on the depth of the groove 460. Facet height 330 and the depth of the groove 460 are measured perpendicularly to the plane in which the various layers 402, 420, 410 mainly lie, i.e. along the vertical in FIGS. 4a to 4i.

The grooves 460 therefore preferably have a flat bottom 421. This bottom is formed by the top face of the stop layer 420.

As already mentioned above, chemical baths are a source of nonuniformities. The use of SOI substrates or, more generally, of SOX substrates, thus allows facets 330 to be obtained that have very uniform heights over the entire surface of the substrate and a controlled thickness despite nonuniformities due to the chemical etch. The residual nonuniformity is then that of the thickness 411 of the silicon layer of the SOI, which is only a few percent as specified by various suppliers of this type of substrate. This remains true for substrates (also commonly referred to as wafers) of large diameter (typically 300 mm) and for small silicon-surface-layer thicknesses (smaller than 20 nm).

Figure 4G:
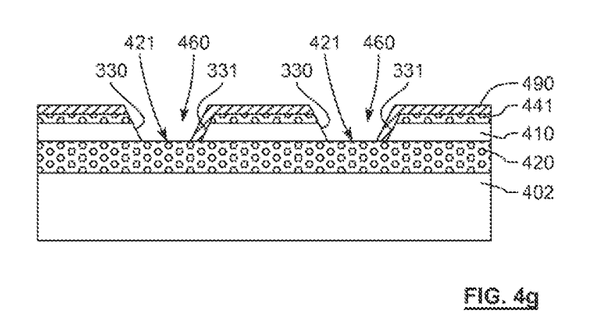

According to one embodiment, once the grooves 460 have been produced, a mask 419 that is configured to cover all the top face of the structure with the exception of the facets 330 of {111} orientation is then formed. This mask 490 is illustrated in FIG. 4g. This mask 490 is typically formed from an oxide, for example from $SiO_2$.

Thus, this step of masking the top surface of the single-crystal substrate is carried out such that the facets 331 of {111} orientation opposite the facets 330 having a {111} crystal orientation are masked.

The production of this mask 490 typically comprises depositing a material comprising at least one among: silicon oxide ($SiO_2$), silicon nitride (SiN), and titanium nitride (TiN).

According to a first embodiment, the deposition of this mask 490 is an angular deposition carried out such that all the top surface of the single-crystal substrate 410 is masked, with the exception of said facets 330 that have a {111} crystal orientation. The angle of inclination of the deposition means that one portion of the trench, corresponding to the facets 330, is not accessible and therefore does not receive the deposited material. This step is accomplished with the aid of a standard piece of equipment known as an ion beam sputterer (IBS), in which the angle of the deposition may be adjusted. This deposition with an inclined angle may also be obtained with the electron-beam-physical-vapor-deposition (EBPVD) technique, in which a target anode under vacuum is bombarded with an electron beam.

Alternatively to these techniques allowing an inclined deposition of the material forming the mask 490, provision may also be made to deposit a masking layer of a material comprising at least one among: silicon oxide ($SiO_2$), silicon nitride (SiN), and titanium nitride (TiN); then, following the deposition, the facets 330 of {111} orientation are laid bare in order to uncover them and allow the contact between the nitride to be grown epitaxially and the silicon of the facets 330 of {111} orientation.

Figure 4H:
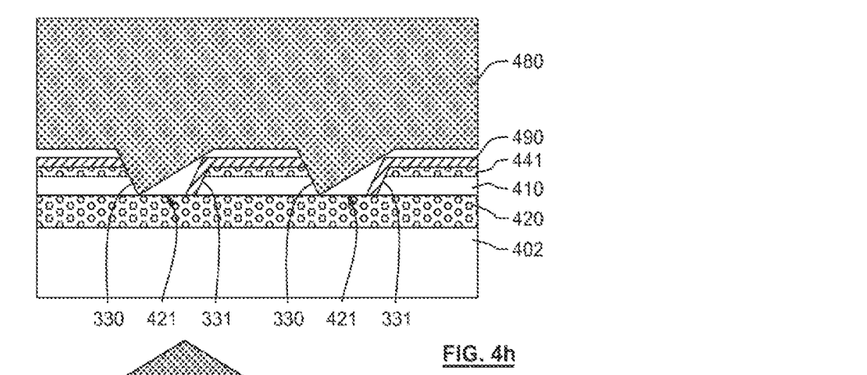
Figure 4I:
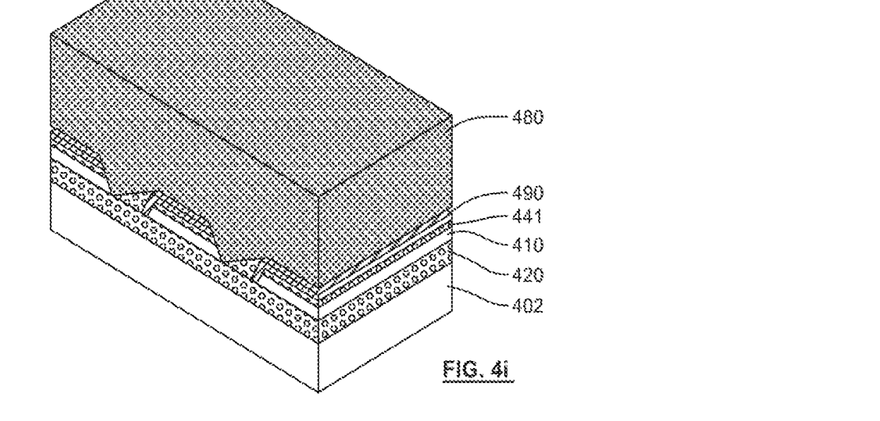

As shown in FIG. 4h, the crystallites 470 that are then grown from these facets 330 of {111} orientation are then all of a substantially equal size, to within the uncertainty in the variation in the thickness 411 of the single-crystal layer 410, greatly facilitating the coalescence and the obtainment of planar semipolar surfaces 480 over the entire extent of a substrate, such as illustrated in FIG. 4i.

According to one embodiment, a first nitride layer is grown epitaxially and directly in contact with the facets 330 of {111} orientation of the single-crystal layer. Typically, this first layer of nitride is of AlN. Next, a second nitride, for example of GaN, is then grown from the first epitaxially grown nitride layer. The interface between the layers the first and second nitride layers is not shown in the figures. This first nitride layer, typically made of or based on AlN, allows melt-back etching to be decreased as explained above.

The dimensions of the facets 330 of {111} orientation obtained from the single-crystal surface layer 410 are preferably comprised in a range of values extending from 20 nm to 2 μm, which corresponds to a range of thicknesses 411 of the surface layer of about 10 nm to 1 μm depending on the crystal orientation of the starting surface. The periods of repetition of the bands 441 of the mask 440 are preferably comprised in a range of values extending from 2 to 10 μm.

It should be noted that the use of the facets 330 of very small sizes, which may be obtained with the process of the invention even on substrates of large size, allows the problem of melt-back etching described with respect to the prior art and that arises in the step of growth of the layer of GaN to be greatly minimized or even eliminated. As was seen above, this destructive effect is due to the reactivity of the silicon, which is raised during the phase of growth of the crystallites to temperatures high enough that it can react with gallium. This generally leads to the creation of cavities due to the untimely etching of the silicon of the substrate reacting with the gallium. The AlN buffer layer (not shown) that is deposited on the silicon before the growth of GaN is started may here be much more effective because of the small areas of silicon exposed during the growth, drastically decreasing or even completely eliminating this problem.

It will finally be noted that the SOX structure used will allow the layer 480 of nitride of semipolar orientation that is grown from the facets 330 to be easily debonded. Specifically, the interfaces between the single-crystal layer 330 and the stop layer 420 (for example an $Si/SiO_2$ interface) are mechanically fragile, thereby allowing the nitride layers 480 to be separated from their original substrate without breakage, provided that they are of sufficient thickness, thus obtaining uniform free-standing layers of GaN. For layer thicknesses of several hundred microns (μm), semipolar pseudo-substrates are then obtained that may be of very large size, in particular if they are compared to those obtained, as described with respect to the prior art, by cutting at an angle an ingot of GaN of c orientation, of a diameter that does not exceed 1 inch or 2.5 cm—the maximum size that it is currently known how to obtain.

According to one embodiment (not illustrated), an additional step is carried out after the step of producing the plurality of parallel grooves and before the step of epitaxial growth of the single-crystal layer. This additional step comprises producing a plurality of parallel trenches that extend in a direction having undergone a rotation with respect to the main direction in which the parallel grooves 360 extend.

According to one embodiment, the trenches are turned, with respect to the grooves 360, by an angle this is larger than 40° and that is preferably comprised between 50° and 90°, this angle being measured in a plane parallel to the main plane in which the carrier layer 402 lies.

Thus, the trenches thus interrupt the continuous grooves 360 so as to form a matrix-array of individual facets each having a {111} crystal orientation. Thus, during the epitaxial growth step, the material grows solely from said individual facets that have a {111} crystal orientation and that form said matrix-array. Preferably, the trenches and the grooves each have a bottom, the bottom of the trenches being located at the same depth or below the bottom of the grooves.

The formation of the trenches, which are inclined with respect to the grooves, allows the available areas of the facets having a {111} crystal orientation to be decreased. This optional but advantageous embodiment thus allows the footprint serving for the epitaxial growth to be decreased and thus the number of defects, during the epitaxial growth, generated at the GaN/AlN/Si or AlN/Si interface to be decreased, while imposing growth in the appropriate +c direction.

The invention is not limited to the embodiments described above and encompasses all the embodiments covered by the claims.

The invention claimed is:

1. A process allowing at least one semipolar layer of nitride to be obtained, which layer is obtained from a least one among gallium, indium and aluminum on a top surface of a single-crystal layer based on silicon or based on germanium, said process comprising the following steps:
    etching, from the top surface of the single-crystal layer, a plurality of parallel grooves that mainly extend in a first direction, each groove comprising at least two opposite inclined facets, at least one of said two opposite facets having a {111} crystal orientation;
    forming a mask on top of the top surface of the single-crystal layer such that the facets opposite said facets having a {111} crystal orientation are masked and that said facets having a {111} crystal orientation are not masked; and
    epitaxial growth of said semipolar layer of nitride from said not masked facets;
    wherein said etching is carried out on a stack comprising the single-crystal layer and at least one stop layer (420) that is surmounted by the single-crystal layer and wherein
    said etching etches said single-crystal layer selectively with respect to said stop layer so that said etching stops on contact with said stop layer, and
    wherein the single-crystal layer has a thickness smaller than or equal to 900 nm ($10^{-9}$ meters).

2. The process as claimed in claim 1, wherein the thickness of the single-crystal layer is such that, in the etching step, the two opposite inclined facets of a given groove reach the stop layer without meeting.

3. The process as claimed in claim 1, wherein said first direction, in which the grooves extend, corresponds to a direction common to the plane of said top surface and to the <111> plane.

4. The process as claimed in claim 1, wherein said step of epitaxial growth comprises:
    a first epitaxial growth of a material based on aluminum nitride from said not masked facets that have a {111} crystal orientation;
    then at least one second epitaxial growth of a material based on gallium nitride from said material based on aluminum nitride.

5. The process as claimed in claim 1, wherein the stop layer is configured to allow an epitaxial growth from the single-crystal layer without epitaxial growth from the stop layer.

6. The process as claimed in claim 1, wherein the single-crystal layer makes direct contact with the stop layer.

7. The process as claimed in claim 1, wherein the stack comprises a carrier layer surmounted by the stop layer.

8. The process as claimed in claim 7, wherein the stop layer makes direct contact with the carrier layer.

9. The process as claimed in claim 1, wherein the stop layer is obtained by oxidizing one surface at least of the carrier layer.

10. The process as claimed in claim 1, wherein the stop layer is a layer chosen from: a layer of oxide, a layer of SiC, and a layer of $Al_2O_3$.

11. The process as claimed in claim 1, wherein the single-crystal layer has a thickness comprised between 2 nm ($10^{-9}$ meters) and 900 nm.

12. The process as claimed in claim 1, wherein the single-crystal layer has a thickness smaller than or equal to 750 nm.

13. The process as claimed in claim 12, wherein the single-crystal layer has a thickness smaller than or equal to 600 nm.

14. The process as claimed in claim 1, wherein the single-crystal layer has a thickness comprised between 50 nm and 600 nm.

15. The process as claimed in claim 1, wherein the single-crystal layer is a layer obtained beforehand on a donor substrate then added to the stop layer.

16. The process as claimed in claim 1, wherein the V/III molar ratio of said material containing nitride and at least one among gallium, indium and aluminum is comprised between 100 and 2000.

17. The process as claimed in claim 16, wherein the V/III molar ratio of said material containing nitride and at least one among gallium, indium and aluminum is comprised between 300 and 500.

18. The process as claimed in claim 1, wherein the step of forming a mask comprises an angular deposition of a masking material, which deposition is carried out such that all the single-crystal layer is covered with the exception of said facets that have a {111} crystal orientation.

19. The process as claimed in claim 18, wherein the masking material comprises at least one among the following materials: silicon oxide, silicon nitride, and titanium nitride.

20. The process as claimed in claim 1, wherein the nitride is gallium nitride.

21. The process as claimed in claim 1, wherein the plurality of parallel grooves has a pitch p1 that is comprised between 50 nm and 20 μm.

22. The process as claimed in claim 1, wherein the parallel grooves of the plurality of parallel grooves mainly extend in a first direction, and the process also comprises the following steps, which are executed after the step of obtaining the plurality of parallel grooves and before the step of epitaxial growth of the single-crystal layer:

etching a plurality of parallel trenches that extend in a second direction having undergone a rotation with respect to said first direction, and that thus interrupt the continuous grooves so as to form a matrix-array of individual facets each having a {111} single-crystal orientation; the trenches and the grooves each having a bottom, the bottom of the trenches being located at the same depth or below the bottom of the grooves; and wherein, during said epitaxial growth step, said material grows solely from said individual facets that have a {111} crystal orientation and that form said matrix-array.

23. The process as claimed in claim 22, wherein said first and second directions define an angle that is larger than 40°.

24. The process as claimed in claim 22, wherein the plurality of parallel grooves has a pitch p1 and wherein the plurality of parallel trenches have a pitch p2 that is larger than $$\frac{p1*0.8}{2.5}.$$

25. The process as claimed in claim 22, wherein the plurality of parallel grooves has a pitch p1 and wherein the plurality of parallel trenches has a pitch p2 that is smaller than 1.1*p1.

26. A microelectronic device comprising a single-crystal layer and a semipolar layer of at least one layer of a nitride of at least one among gallium, indium and aluminum on a top surface of the single-crystal layer, the single-crystal layer comprising a plurality of parallel grooves, each groove comprising at least two opposite inclined facets each forming a continuous band, at least one of said two opposite facets having a {111} crystal orientation;

said nitride layer making direct contact with the facets having a {111} crystal orientation;

wherein the single-crystal layer surmounts a stop layer and wherein each groove extends from a top face of the stop layer and passes right through the single-crystal layer and the single-crystal layer has a thickness smaller than or equal to 900 nm ($10^{-9}$ meters).

27. The device as claimed in claim 26, wherein the grooves have a flat bottom that is formed by the top face of the stop layer.

28. A light-emitting diodes comprising a microelectronic device as claimed in claim 26.

* * * * *